(12) United States Patent
Fukumoto

(10) Patent No.: US 6,240,032 B1
(45) Date of Patent: May 29, 2001

(54) NON-VOLATILE SEMICONDUCTOR MEMORY ALLOWING USER TO ENTER VARIOUS REFRESH COMMANDS

(75) Inventor: Katsumi Fukumoto, Nara (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/199,875

(22) Filed: Nov. 24, 1998

(30) Foreign Application Priority Data

Nov. 27, 1997 (JP) ..................................... 9-326033

(51) Int. Cl.[7] ............................. G11C 7/00; G11C 16/04
(52) U.S. Cl. ...................................... 365/222; 365/185.11
(58) Field of Search ..................... 365/185.11, 185.29, 365/185.33, 218, 222

(56) References Cited

U.S. PATENT DOCUMENTS

| | | | |
|---|---|---|---|
| 5,053,990 | 10/1991 | Kreifels et al. | 364/900 |
| 5,239,505 | * 8/1993 | Fazio et al. | 365/185.11 |
| 5,245,570 | 9/1993 | Fazio et al. | 365/185 |
| 5,249,158 | 9/1993 | Kynett et al. | 365/230.03 |
| 5,365,486 | 11/1994 | Schreck | 365/222 |
| 5,574,684 | * 11/1996 | Tomoeda | 365/185.09 |
| 5,699,297 | * 12/1997 | Yamazaki et al. | 365/185.11 |
| 5,963,473 | * 10/1999 | Norman | 365/185.11 |

FOREIGN PATENT DOCUMENTS

| | | |
|---|---|---|
| 58-130498 | 8/1983 | (JP) . |
| 60-074578 | 4/1985 | (JP) . |
| 1-134793 | 5/1989 | (JP) . |
| 7-37397 | 7/1995 | (JP) . |

* cited by examiner

*Primary Examiner*—Trong Phan
(74) *Attorney, Agent, or Firm*—Morrison & Foerster

(57) ABSTRACT

In a non-volatile flash memory having memory cells divided into blocks, a command state machine decodes a refresh command entered, and sends a decoded result to a write state machine. The write state machine performs a refresh operation in accordance with the decoded result. The nonvolatile flash memory allows a user to enter the refresh command. The refresh command includes "SINGLE BLOCK REFRESH", "FULL CHIP REFRESH", "REFRESH SUSPEND", and "REFRESH RESUME".

19 Claims, 12 Drawing Sheets

SELECTION SIGNAL

Fig. 9

| COMMAND | FIRST WRITE CYCLE | | SECOND WRITE CYCLE | |
|---|---|---|---|---|
| | ADDRESS | DATA | ADDRESS | DATA |
| DATA WRITE | Don't care | 40H | WA | WD |
| BLOCK ERASE | Don't care | 20H | BA | D0H |
| FULL CHIP ERASE | Don't care | A7H | Don't care | D0H |
| ERASE SUSPEND | Don't care | B0H | | |
| ERASE RESUME | Don't care | D0H | | |

WA : WRITE ADDRESS  WD : WRITE DATA

BA : BLOCK ADDRESS

Fig. 10

| COMMAND | FIRST WRITE CYCLE | | SECOND WRITE CYCLE | |
|---|---|---|---|---|
| | ADDRESS | DATA | ADDRESS | DATA |
| SINGLE BLOCK REFRESH | Don't care | 30H | BA | D0H |
| FULL CHIP REFRESH | Don't care | B7H | Don't care | D0H |
| REFRESH SUSPEND | Don't care | B0H | | |
| REFRESH RESUME | Don't care | D0H | | |

NON-VOLATILE SEMICONDUCTOR MEMORY ALLOWING USER TO ENTER VARIOUS REFRESH COMMANDS

TECHNICAL FIELD OF THE INVENTION

The present invention relates generally to storage devices to be used for computers and portable information devices. More particularly, the present invention relates to electrically erasable programmable non-volatile semiconductor memories, especially to such non-volatile memories storing multi-valued data in each of memory cells thereof.

BACKGROUND OF THE INVENTION

One type of known non-volatile storage devices is erasable programmable read only memories ("EPROMs"). The EPROMs can be programmed (written) by a user.

In order to erase the EPROMs, it is necessary to irradiate the memory cells of the EPROMs with ultraviolet rays. The entire memory cell array is collectively erased by the ultraviolet ray irradiation. For this purpose, the EPROM must be removed from a substrate each time it is rewritten with new data.

Because the EPROMs have a small memory cell area, they are suitable for large capacity storage. The EPROMs, however, require a window-provided package because the data thereof is erased by ultraviolet ray irradiation. Furthermore, because reprogramming is carried out using a writing device called programmer (or writer), the EPROM needs to be removed from the system when writing data.

Conventionally known electrically erasable programmable read only memories ("EEPROMs") can be electrically reprogrammed within systems in which they are provided. The area of a memory cell of the EEPROMs is, however, about 1.5 to 2 times as large as that of the memory cell of the EPROMs. This results in that the EEPROMs are larger and more costly than the EPROMs. Therefore, it is difficult to provide the EEPROMs with large capacities.

Thus, recently, a memory called "flash memory" (or flash EPROM) has been developed as an intermediate memory between the EPROM and the EEPROM.

The flash memory is a non-volatile semiconductor memory having a function of electrically erasing data of a chip at a time or electrically erasing data of memory cells positioned in a certain region called a sector or a block at a time. The memory cell of the flash memory has an area almost equal to that of the memory cell of the EPROM.

A memory cell, shown in FIG. 5, for the flash memory is known from U.S. Pat. No. 5,249,158 and U.S. Pat. No. 5,245,570. The memory cell 501 shown in FIG. 5 has a floating gate type field effect transistor structure in which one bit (one cell) is composed of one element. Thus, the memory cell 501 can be highly integrated with ease.

Writing data to the memory cell 501 is performed by applying about 12 volts to a control gate electrode 502, about 7 volts to a drain 503, and 0 volts to a source 505 to thereby inject hot electrons generated in the vicinity of a drain junction to a floating gate electrode 506. By the data write, the threshold voltage of the memory cell 501 with respect to the control gate electrode 502 becomes high.

By arranging the memory cell 501 shown in FIG. 5 to have a multi-value, higher integration will be easily achieved. For example, the memory cell 501 may have a plurality of threshold voltages Vth at which the memory cell takes a $2^n$ state at intervals of several hundred millivolts.

In this case, the writing of data to the memory cell 501 is performed by applying 0 volts to the source 505, pulses of several microseconds to the floating gate electrode 506 at about 12 volts, and pulses of several microseconds to the drain 503 at about 7 volts to thereby inject hot electrons generated in the vicinity of the drain junction to the floating gate electrode 506.

By the data writing, the threshold voltage Vth of the memory cell 501 with respect to the control gate electrode 502 increases. The threshold voltage Vth can be varied by changing the voltage to be applied to the control gate electrode 502, the drain voltage or the pulse to be applied to the control gate electrode 502 or the drain 503.

In order to erase data from the memory cell 501, the floating gate electrode 506 is grounded and a positive high voltage (about 12 volts) is applied to the source 505. Thus, high electric field is generated between the floating gate electrode 506 and the source 505, and electrons stored in the floating gate electrode 506 are drawn to the source 505 by utilizing the tunnel phenomenon through a thin gate oxide film.

Normally, data is erased block by block (for example, in 16K bytes or 64K bytes). The data erasure causes the threshold voltage Vth of the memory cell 501 with respect to the control gate electrode 502 to drop. The memory cell 501 does not have a selection transistor. Thus, when the threshold voltage Vth becomes negative due to excess erasure, a fatal disadvantage that data cannot be correctly read takes place.

When the memory cell 501 stores binary data, the memory cell is read by applying 0 volts to the source 505, a low voltage about 1 volt to the drain 503, and about 5 volts to the control gate electrode 502. The size of a channel current flowing at this time corresponds to information "1" or "0". Specifically, a larger channel current corresponds to information "1" and a smaller channel current corresponds to information "0". This fact is utilized for the data reading. The reason a low voltage is applied to the drain 503 is to prevent parasitic write operation (so-called "soft write") from being performed.

When the memory cell 501 stores multi-valued data, in reading the memory cell 501, 0 volts is applied to the source 505, a low voltage of about one volt is applied to the drain 503, and a voltage to be applied to the control gate electrode 502 is changed. The multi-valued memory data is read by utilizing the value of a voltage applied to the control gate electrode 502 at which voltage the channel electric current flows.

In the memory cell 501, because writing is executed at the drain side and erasure is executed at the source side, it is preferable to optimize junction profiles individually for each operation. That is, the source 505 and the drain 503 are asymmetric in structure relative to each other; in the drain junction, an electric field convergence type profile is used to enhance writing efficiency; and in the source junction, an electric field relaxation type profile allowing application of a high voltage to the source 505 is adopted.

In the method of applying a high voltage to the source 505 in the erase operation, it is necessary to increase the withstanding voltage in the source junction. Thus, it is difficult to make the structure at the source electrode side fine. Further, hot holes are generated in the neighborhood of the source 505 and a part of the hot holes is trapped inside the tunnel insulation film. Thus, reliability of the cell deteriorates.

As another example of data erasure, negative gate erasing method is known. In this method, a negative voltage (about −10 volts) is applied to the control gate electrode 502, and a power voltage (about 5 volts) is applied to the source 505, and data is erased by tunnel electric current. One of the advantages of the negative erasure method is that because a low voltage is applied to the source 505 at a data erasure time, the junction withstanding voltage at the source side is allowed to be low and that it is possible to reduce the length of the gate of the memory cell. Further, the negative erasure method allows the size of a erase block to be small so that data can be erased easily sector by sector.

In the data erasing method of applying a high electric field to the source 505, tunnel electric current flows between bands and the value of the total electric current of an entire chip is as high as several milliamperes. Thus, it is difficult to use a boosting circuit in the data erasure method. Accordingly, heretofore, an erasing high voltage Vpp is supplied from the outside of the chip.

In the negative gate erasing method, it is possible to supply a power voltage Vcc (5 or 3 volts) to the source 505. Thus, the negative gate erasure method has an advantage that operation of the memory by a single power source can be realized comparatively easily.

In the method of using hot electrons for writing, electric current about 1 mA flows per memory cell in the data-writing time. Thus, a known particular type of flash memory uses FN (Fowler-Nordheim) tunnel electric current to reduce electric current flowing per memory cell in the data-writing time, like the EPROMs.

Meanwhile, as semiconductor-manufacturing process has become fine and battery-driven portable equipment has been widely used, a low voltage is demanded for an operating power source. Thus, there is a demand for development of a memory that is operated by a single power supply of 3.3 volts, not 5 volts. Thus, research and development are energetically made in compliance with such a demand.

In reading data with the power source of 3.3 volts, in the existing flash EPROMs, a supply electric potential (Vcc=3.3 volts) is applied to a control gate line (i.e., a word line). Otherwise, to accomplish a high-speed operation and expand an operation margin, an internally increased voltage of about 5 volts are applied to the control gate line.

Such a non-volatile semiconductor memories have more operation states than random access memories (RAMs) capable of writing and reading data in a short time. The operation states include a write state, a block erasure state, a simultaneous entire chip erasure state, and a status-register reading state. When associating such large a number of operation states of the non-volatile semiconductor memory with combinations of external control signals ($\overline{CE}$, $\overline{WE}$, etc.), the control signals that are used for the EPROMs and the EEPROMs are insufficient. Thus, it is necessary to add new control signals, which makes the memories difficult to operate.

In order to overcome such a problem, as disclosed in the U.S. Pat. No. 5,053,990, a command method which does not use an increased number of control signal lines has been proposed and come to be widely used. In the non-volatile semiconductor memories adopting the command method, a command entered by a user is sent to a command state machine (CSM). The command is recognized by the command state machine. Based on the recognition made by the command state machine, a write state machine (WSM) executes an operation (erase, write, etc.) corresponding to the command.

A non-volatile semiconductor memory of this kind is also disclosed in U.S. Pat. No. 5,249,158 in which the chip is divided non-uniformly into erase blocks. U.S. Pat. No. 5,245,570 also discloses a non-volatile semiconductor memory of such a kind in which the erase blocks are of the same size.

In addition, a non-volatile semiconductor memory in which write and erase operations are performed by means of FN tunnel electric current is also known. A memory cell system called NAND type in which 8 or 16 memory cells are connected in series is also known. The NAND type memory cell system is slower than the NOR type memory cell system in reading speed, but has an advantage in that the size thereof can be reduced.

As described previously, normally one memory cell stores a binary data (one bit). Research and development are made to allow one memory cell to store multi-valued data such as a quaquaternary value (two bits), an octal value (three bits), and a hexadecimal value (four bits).

FIG. 11 shows a non-volatile semiconductor memory (flash EEPROM) 110, as disclosed in the U.S. Pat. No. 5,365,486, capable of performing refresh operation. As shown in FIG. 11, addresses and data are supplied to the non-volatile memory 110 from the outside. The non-volatile memory 110 has a column decoder 112, a word line decoder 114, and read/write/erasure circuitry 116. The read/write/erasure circuitry 116 is connected with both the column decoder 112 and the word line decoder 114. A memory cell array in the non-volatile memory 110 is divided into various sectors 118, 120, 122, 124, 126, and 128. The sectors 118, 120, and 122 share common bit lines extending from the column decoder 112. The sectors 124, 126, and 128 also share common bit lines extending from the column decoder 112. Further, the sectors 118 and 124 share common word lines from the word line decoder 114. Similarly, the sectors 120 and 126, and the sectors 122 and 128 share common word lines extending from the word line decoder 114, respectively. All of the bit lines from the column decoder 112 are coupled to a sense amplifier 130, which is used to sense data on various bits and transmit the data for external communications. Refresh circuitry 132 is coupled to the column decoder 112, the word line decoder 114, and the read/write/erasure circuitry 116. Memory cells constituting one sector shown in FIG. 11 are arranged as shown in FIG. 12 which shows a typical array of the memory cells. The memory cells, indicated by reference symbol MC, are coupled to the column decoder 112 and the word line decoder 114. The refresh circuitry 132 is coupled to the output of a sense amplifier 154. An erase cycle counter 156 is coupled to the refresh circuitry 132 and receives inputs from other sectors. The frequency with which the refresh circuitry 132 reads each array of memory cells MC is determined by the erase cycle counter 156. The erase cycle counter 156 counts the number of erase cycles performed in sectors electrically associated with the sector shown in FIG. 12. That is, the erase cycle counter 156 counts the number of erase cycles which could cause disturb conditions in the sector shown in FIG. 12. The erase cycle counter 156 is set according to the particular needs of the system in which the non-volatile semiconductor memory 110 is included. For example, the erase cycle counter 156 is set at 10, so that refresh occurs after any 10 erase cycles from any of the sectors that could cause disturb conditions within the sector shown in FIG. 12. In another example, the erase cycle counter 156 is set at one.

Referring to FIG. 11, for example, once a total of 10 erase cycles has been performed in the sectors 120, 122, and 124, a refresh for the sector 118 is performed, with the erase cycle counter 156 set at 10. For example, if two erase cycles were performed in the sector 120, five in the sector 122, and three in the sector 124, a refresh cycle would be performed in the sector 118.

The refresh circuitry 132 controls the column decoder 112 and the word line decoder 114 for refresh of each sector in the non-volatile semiconductor memory 110. Further, the erase cycle counter 156 counts erase cycles in each sector such that the refresh circuit 132 refreshes the appropriate sectors as needed. The refresh operation is performed in accordance with the flowchart of FIG. 13.

The refresh operation is described below by using the flowchart of FIG. 13. Initially, the program goes to step S42 at which a particular cell is read at an elevated control gate voltage, Vcg (for example, 7 volts), to determine whether the memory cell has been programmed. Since programmed memory cells should not conduct, placing an elevated voltage on the control gate of a particular cell will result in conduction unless that cell is programmed, and its floating gate has enough charge on it to prevent conduction. If a programmed memory cell has been disturbed and some its charge is gone, for example, through word line stress or bit line stress, electric current flows as a result of application of the elevated voltage to the control gate. Thus, at decision step S44, an initial determination is made whether the memory cell is programmed. If no conduction occurs through the cell at the elevated control gate voltage applied at step S42, then the cell has been programmed and has not been disturbed. Thus, data of the next memory cell is read at the following step S46. If, however, it is determined at step S44 that conduction has occurred after application of the elevated control gate voltage at step S42, the program goes to step S48. At step S48, the particular bit is read at a lowered control gate voltage (for example, 5 volts). The lowered control gate voltage should be high enough to ensure conduction if the bit is an erased bit, and not so low as to result in no conduction for an erased bit that has been disturbed through a soft write. It is determined at decision step S50 whether or not the cell is a programmed cell. If there is conduction at the lowered control gate voltage, then the cell is an erased cell and no refresh is necessary, and the next cell is read at step S46. However, if no conduction occurs after application of the lowered control gate voltage to the particular cell, it is determined that the cell has been programmed, but has been disturbed. This information results because conduction occurred at the elevated control gate voltage, but did not occur at the lowered control gate voltage, indicating that some of the electric charge has left the floating gate. Thus, step S52 is encountered and the particular memory cell is refreshed.

Because of progress of semiconductor technologies which has been achieved in recent years, the film thickness of an oxide film to be formed under the floating gate electrode 506 of the non-volatile semiconductor memory is about 100 Å, and is expected to continue to be further thinned. However, as the oxide film becomes thinner, leak current tends to increase.

In the flash memory as described above, data is stored according to whether an electric charge is present on the floating gate electrode 506 or not. Thus, as semiconductor-manufacturing process becomes finer and the tunnel oxide film becomes thinner, there occurs a problem that the leak current causes the electric charge to easily leave the floating gate electrode 506, resulting in unexpected data erasure. In particular, in a memory for storing quaternary, or 4-valuted data (two bits) or octal data, or 8-valued data (three bits), difference between states (difference between threshold voltages Vth of memory cell) is small. Thus, increase of the leak current is a serious problem.

Furthermore, as the manufacturing process becomes finer and the tunnel oxide film becomes thinner, the leak current causes the electric charge to leave the floating gate 506 easily, resulting in poor yield.

Japanese Patent Laid-Open Publication No. 60-74578 discloses a non-volatile memory wherein by incorporating in a memory cells' peripheral circuit a means of storing the number of rewrites of a memory cell, refresh is automatically performed each time the number of rewrites of the memory cell exceeds a predetermined value. In this technique, a user cannot select a refresh timing. Thus, even though the user wants to read or write data, the system is placed in a refresh mode when the number of data-rewriting times exceeds the predetermined value. Thus, the user has inconvenience in using it.

Japanese Patent Laid-open Publication No. 1-134793 discloses a non-volatile memory in which a refresh is performed in response to application of supply voltage.

Also, as described above in detail, the U.S. Pat. No. 5,365,486 (corresponding to Japanese Patent Laid-open Publication No. 7-37397) discloses a non-volatile semiconductor memory in which a potential of a word line is elevated and lowered such that refresh of a particular memory cell is performed based on results of decisions made at two different read voltages.

In any of the known non-volatile memories, the user cannot select a refresh operation or a read operation according to the user's intention. Also, the user is not informed as to whether refresh is being performed. Thus, those non-volatile memories are inconvenient for the user.

SUMMARY OF THE INVENTION

It is therefore an object of the present invention to provide a non-volatile semiconductor memory which is able to perform a refresh operation when desired by a user so as to offer convenience to the user, and which performs the refresh operation reliably.

In order to accomplish the above object, the present invention provides a non-volatile semiconductor memory capable of rewriting memory cells block by block or sector by sector by a command method in which a predetermined operation is performed according to data and/or an address entered from outside according to a bus cycle, comprising refresh means for performing a refresh operation on a selected block or sector by setting a refresh command.

Each memory cell can store not only a binary data but also multi-valued data.

According to the present invention, a user is allowed to enter the refresh command.

The refresh command may "SINGLE BLOCK REFRESH" command by which only a single block or sector is refreshed.

The refresh command may "FULL CHIP REFRESH" command by which all blocks or sectors on a chip are sequentially refreshed.

The refresh command may include "REFRESH SUSPEND" and "REFRESH RESUME" commands to suspend a refresh operation in progress and then resume the refresh operation.

In order to achieve a stable refresh operation, it is preferable that in a refresh operation, a word line potential is supplied from a high-voltage generation circuit different from a circuit for supplying a word line potential used in an ordinary memory read operation.

In one embodiment, the non-volatile semiconductor memory further includes:

an internal high voltage generation circuit for generating an elevated voltage higher than a power source voltage;

a word line potential generation circuit for generating a first word line potential and a second word line potential different from the first word line potential on the basis of the elevated voltage generated by said internal high voltage generation circuit when the refresh command is executed, said first word line potential being equivalent to a word line potential used for an ordinary memory read operation;

a reading means for performing a first read operation in which a memory cell is read at the first word line potential, and then performing a second read operation in which the memory cell is read at the second word line potential; and a decision means for comparing data read by the first read operation with data read by the second read operation and determining that data stored on the memory cell is normal if the two data are same and that the data stored on the memory cell is abnormal if the two data are different from each other, said refresh means performing a refresh upon the memory cell when said decision means determines that the data stored on the memory cell is abnormal.

When the second word line potential is set to be higher than the first word line potential, inconsistency between the two data indicates that electric charges have left a floating gate of the memory cell, and the memory cell is determined to be abnormal. Then, the refresh means performs a soft write to the memory cell to refill the floating gate of the memory cell with electric charges to thereby increases a threshold voltage of the memory cell.

On the other hand, when the second word line potential is set to be lower than the first word line potential, inconsistency between the two data indicates that excessive electric charges have entered a floating gate of the memory cell, and the memory cell is determined to be abnormal. In this case, the refresh means decreases the electric charges of the floating gate by an erase operation accompanied by, if necessary, a soft write operation. In this way, the refresh means decreases a threshold voltage of the memory cell to a target value.

In one embodiment, the non-volatile memory includes a refresh status informing means for allowing a user to know a refresh status of the memory. The refresh status informing means sets on a status register an information bit indicating a refresh operation in progress while the refresh operation is being performed, and clears the information bit upon completion of the refresh operation.

The refresh status informing means may further set on the status register an information bit indicating that a refresh is needed when said decision means determines that the data of the memory cell is abnormal.

The user can know whether the refresh operation is in progress or not by reading the register information.

In one embodiment, the non-volatile semiconductor memory further comprises block size decision means for determining whether a size of a block including a memory cell to be refreshed is smaller than a predetermined size. If the size of the block is smaller than the predetermined size, the refresh means saves data of the block in an internal storage area, then erases the block, and then writes the data saved in the internal storage area to said memory cell in the refresh operation. On the other hand, if the size of the block is not smaller than the predetermined size, the refresh means saves data of the block in an external storage area, then erases the block, and then writes the data saved in the external storage area to the memory cell in the refresh operation.

The internal or external storage area for data save may be composed of a non-volatile semiconductor memory. In this case, it is possible to prevent the saved data from being lost due to an undesired power failure or other causes during the refresh operation.

In one embodiment, "ERASE SUSPEND" command for suspending a block erase operation is used also as the "REFRESH SUSPEND" command. Also, "ERASE RESUME" command for resuming the block erase operation is used also as the "REFRESH RESUME" command. In this case, the number of commands is reduced, so that simple control is achieved.

Preferably, the refresh means rewrite a memory cell by repeating a write operation plurality of times, preferably 3 or more times, to thereby increase a threshold voltage of the memory cell stepwise to a target value.

Other objects, features and advantages of the present invention will become obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 8A shows a status register to be used in the modification;

FIG. 9 is a table showing examples of commands for a non-volatile semiconductor memory;

FIG. 10 is a table showing examples of refresh commands of the embodiment;

DETAILED DESCRIPTION OF THE PREFERRED EMBODIMENTS

Figure 1:
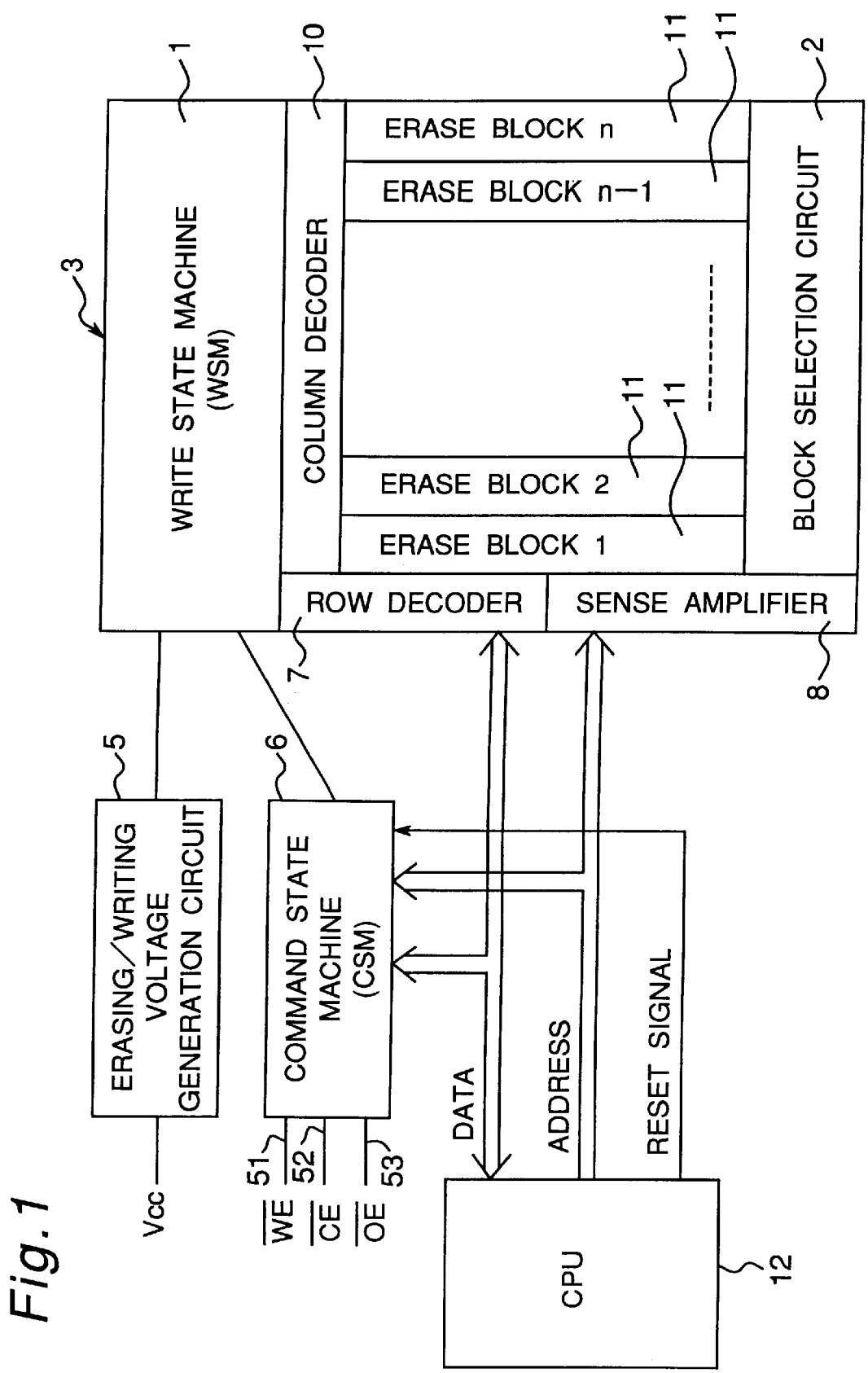
FIG. 1 is a block diagram showing main portions of a non-volatile semiconductor memory according to an embodiment of the present invention.

FIG. 1 is a block diagram showing a flash memory according to an embodiment of the non-volatile semiconductor memory of the present invention.

The flash memory has a write/erase/select section 3 including a write state machine (WSM) 1 and a block selection circuit 2, an erasing/writing voltage generation circuit 5, and a command state machine (CSM) 6.

The write/erase/select section 3 further includes a row decoder 7, a sense amplifier 8, and a column decoder 10, and n erase blocks 11.

The write state machine 1 is supplied with a signal output from the erasing/writing voltage generation circuit 5. The command state machine 6 is supplied with $\overline{WE}$ signal, $\overline{CE}$ signal, $\overline{OE}$ signal, and a reset signal. The command state machine 6 and the write/erase/select section 3 are connected with data lines and address lines.

The erasing/writing (programming) voltage generation circuit 5 is connected with an external power source Vcc and generates an elevated voltage of about 12 volts. The erasing/writing voltage generation circuit 5 generates a negative electric potential when a negative gate erasure is performed.

The command state machine 6 decodes an entered command and sends a decoded result to the write state machine 1.

The write state machine 1 executes erase and write operations corresponding to commands received from the command state machine 6. The column decoder 10 selects a word line. The row decoder selects a bit line.

Data on a bit line selected by the row decoder 7 is sensed by the sense amplifier 8. The block selection circuit 2 selects one erase block (or sector) 11 from n erase blocks 11. Batch erase of the selected erase block 11 is performed unless the selected erase block 11 is write-prohibited (block-locked state). The erase block 11 may be an erase sector.

The write state machine 1 also performs various comparisons and decisions. For example, the write state machine 1 compares data read from a memory cell at different first and second word line potentials with each other and based on the comparison results determines whether the data on the memory cell is normal or abnormal. Also, the write state machine 1 compares the size of a particular erase block (or sector) with a predetermined size to determine whether data of the erase block should be saved on an internal storage area of the flash memory or on an external storage device during a refresh operation described later.

The flash memory of FIG. 1 also has a CPU 12. The CPU 12 performs various comparisons, decisions, and command issuing.

Figure 3:
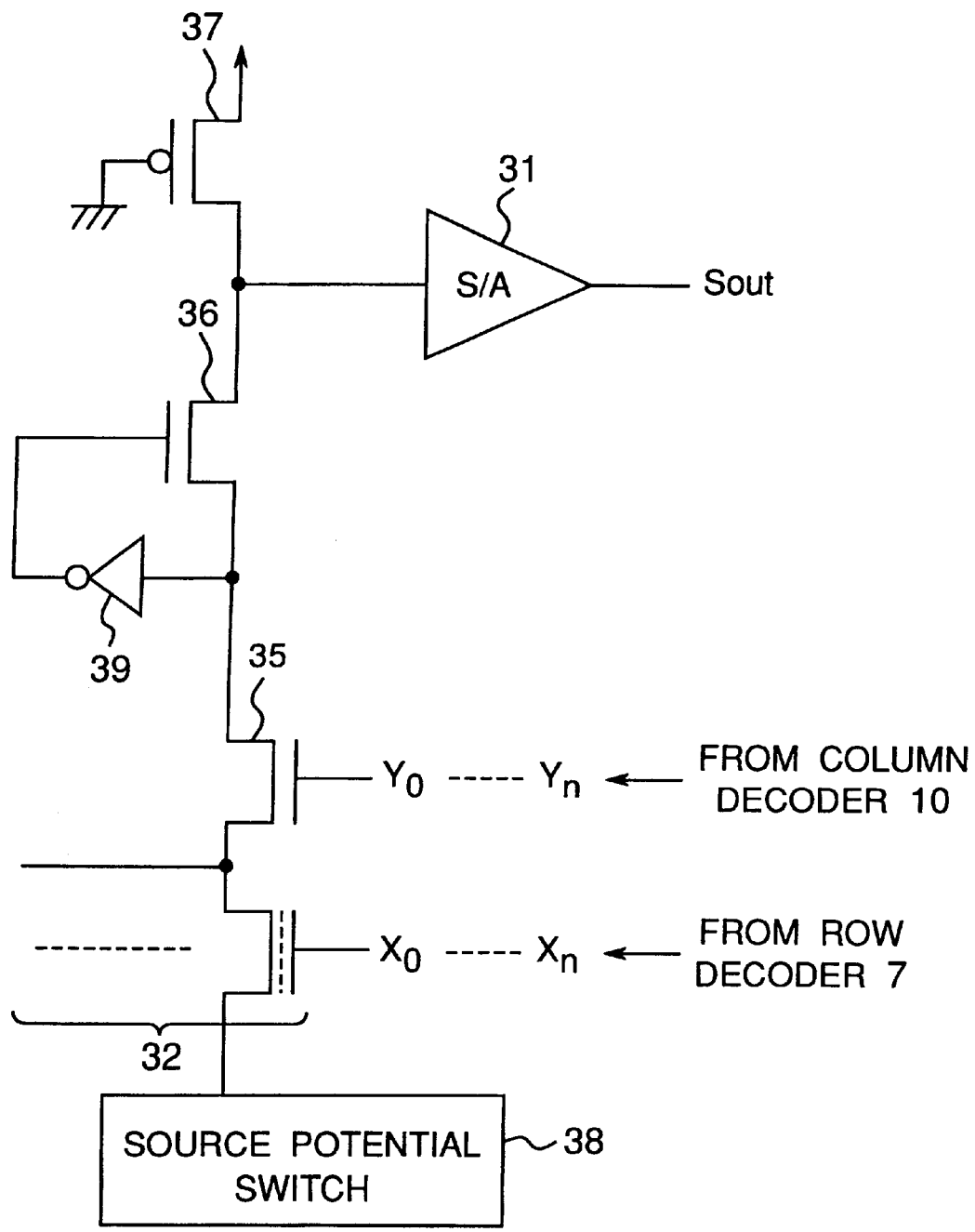
FIG. 3 is a circuit diagram showing connection between a sense amplifier and memory cells in the embodiment.

FIG. 3 shows circuitry connected with a sense amplifier 31 and a memory cell group 32. The memory cell group 32 consists of a plurality of memory cells X0, X1, . . . Xn. These memory cells may have a structure same as that of the conventional memory cell shown in FIG. 5 or a structure in which a ferroelectric thin film is used as a gate oxide film. In the latter case using a ferroelectric thin film, polarization inversion is utilized. Thus, advantageously, it is unnecessary to use a very thin tunnel oxide film unlike the conventional art and also, it is possible to achieve high integration.

The memory cells are connected with a corresponding transistor 35 which is in turn connected with a transistor 36. The transistor 36 is then connected with a transistor 37 connected with a power source. A line connecting the transistors 35 and 36 with each other is connected with a gate of the transistor 36 through an inverter 39. A line connecting the transistors 36 and 37 with each other is connected with input of the sense amplifier 31. The memory cell group 32 is connected with a source potential switch 38.

Figure 4:
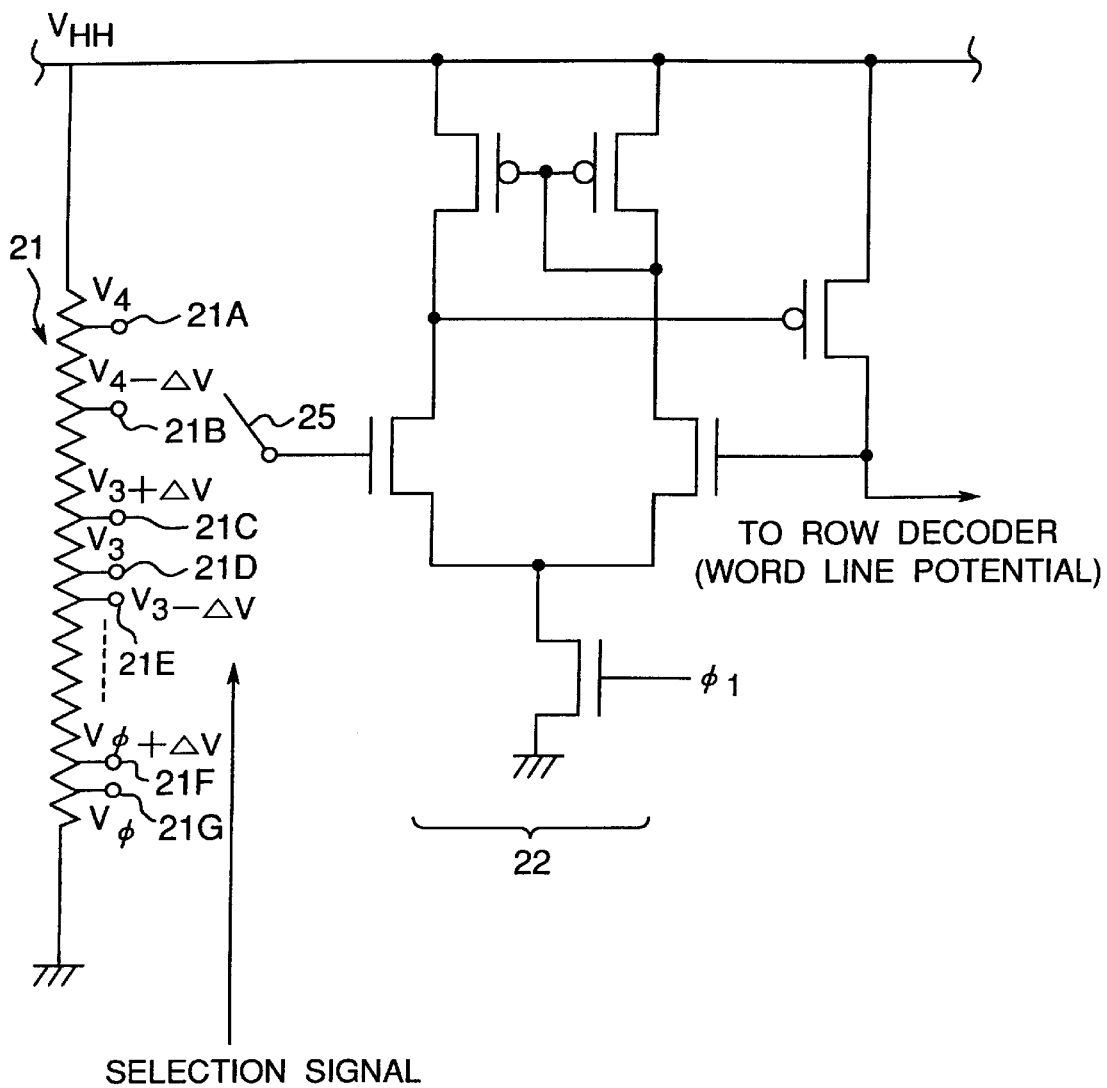
FIG. 4 is a circuit diagram showing a word line electric potential generation circuit in the embodiment.

FIG. 4 shows a word line potential generation circuit to be used for a refresh operation of the embodiment. The word line potential generation circuit includes a voltage-dividing resistor 21, a sense amplifier 22, and a switch 25, and is connected with the row decoder 7 of FIG. 1. The word line potential generation circuit is incorporated in the write state machine 1.

The word line potential generation circuit divides an electric potential VHH by means of the voltage-dividing resistor 21 thereof, thus generating a reference voltage for the electric potential of the word line needed for the refresh operation. The electric potential VHH is generated by the erasing/writing voltage generation circuit 5 shown in FIG. 1.

The voltage-dividing resistor 21 includes a plurality of taps 21A, 21B, 21C, 21D, 21E, . . . 21F, and 21G. One of the taps 21A–21G is selected by the switch 25 and then connected with the sense amplifier 8.

Voltages of V4, V4—ΔV, V3+ΔV, V3, V3–ΔV, VØ+ΔV, VØ are output from the taps 21A through 21G, respectively. One of the taps 21A through 21G is selected by a selection signal output from the write state machine 1 in the refresh operation.

The word line potential generation circuit starts operation when a signal Ø1 supplied to the sense amplifier 22 has an "H" level. An output of the word line potential generation circuit is transmitted to the row decoder 7 shown in FIG. 1.

In the embodiment, data A7H (wherein "H" represents a hexadecimal number) shown in FIG. 9 is supplied to a data pin in the first cycle in which a $\overline{CE}$ pin 52 and a $\overline{WE}$ pin 51 shown in FIG. 1 are both at a "L" level. Then, data D0H is supplied to the data pin in the second cycle in which the $\overline{CE}$ pin 52 and the $\overline{WE}$ pin 51 are at the "L" level. In this manner, "FULL CHIP ERASE" command is given to the command state machine 6.

Normally, the erase process starts from a step at which data "0" is written to all memory cells inside an erase block to be erased. At this time, threshold voltage Vth of those memory cells is set at a large value). After the threshold voltage Vth of each memory cell becomes greater than a specified value, the process goes to a step at which all the memory cells of the erase block are erased at the same time. At this time, the threshold voltage Vth is set at a small value. The write state machine 1 executes these operations.

Figure 2:
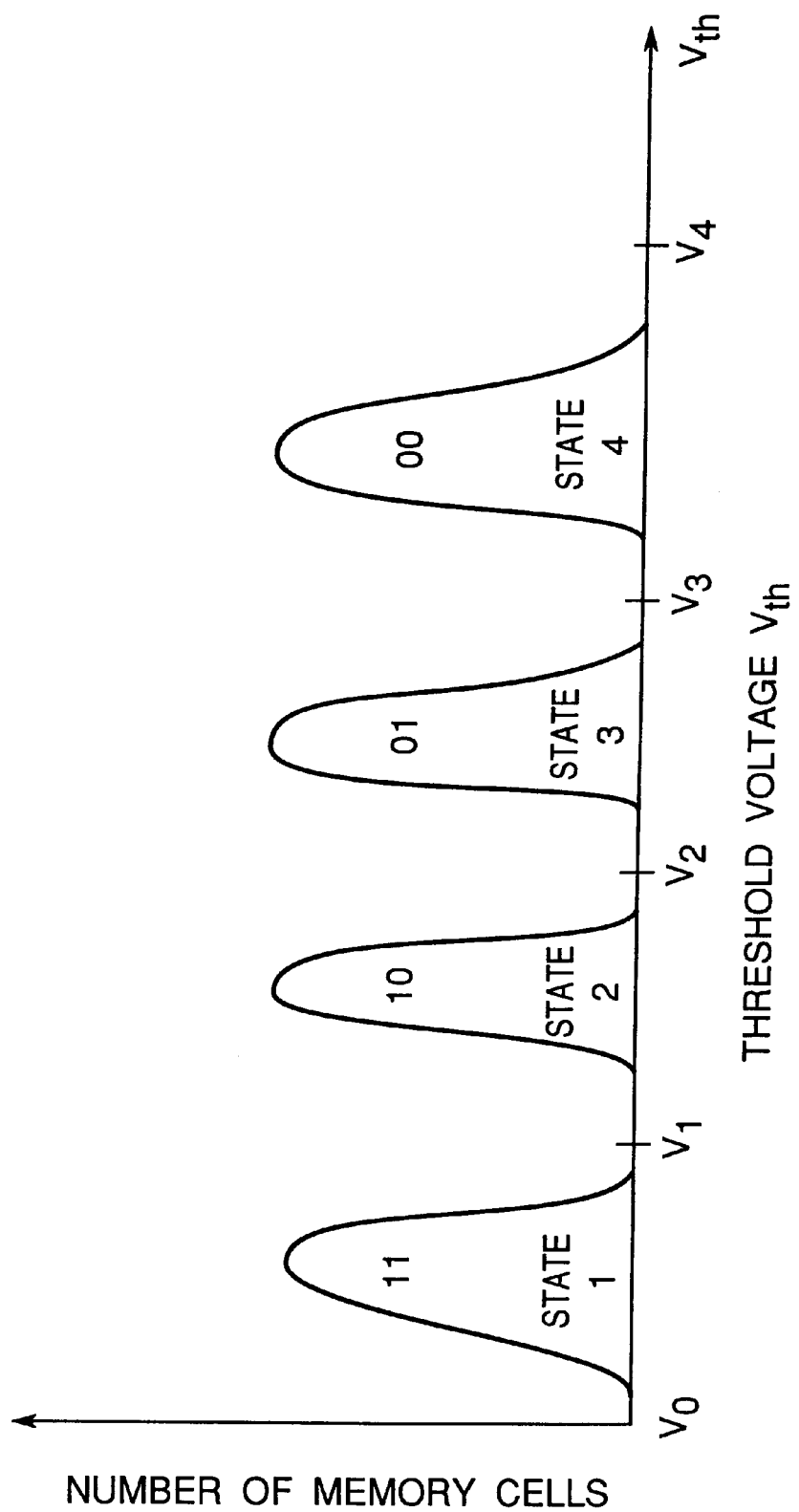
FIG. 2 is a diagram showing a threshold voltage Vth of a memory cell and stored data in the embodiment.

When the non-volatile semiconductor memory of the embodiment has quaternary (4-valued) memory cells, relationship between the threshold voltage Vth of the memory cells and quaternary data (11, 10, 01, 00) is as shown in FIG. 2.

Referring to FIG. 2, the state in which the threshold voltage Vth is lower than V1 is referred to as "state 1" and is associated with data 11. The state in which the threshold voltage Vth is between V1 and V2 is referred to as "state 2" and is associated with data 10. The state in which the threshold voltage Vth is between V2 and V3 is referred to as "state 3" and is associated with data 01. The state in which the threshold voltage Vth is between V3 and V4 is referred to as "state 4" and is associated with data 00.

As obvious from FIG. 2, the number of memory cells is maximum when the threshold voltage Vth is at approximately the center between V1 and V0, between V2 and V1, between V3 and V2, and between V4 and V3.

When input/output data of the non-volatile semiconductor memory of the embodiment includes eight bits (b7, b6, b5, b4, b3, b2, b1, b0), two bits are treated as a unit. That is, combinations of 2 bits (b7, b6), (b5, b4), (b3, b2), and (b1, b0) are stored in four memory cells. Further, depending on a case, nonconsecutive two bits may be grouped. For example, combinations of 2 bits (b7, b3), (b6, b2), (b5, b1), and (b4, b0) may be used. For octal (8-valued) memory cells, three bits make a unit.

Referring again to FIG. 2, to write data 00 to the memory cell in any one of the states other than state 4, a soft write is performed to increase the threshold voltage Vth of the memory cell to a voltage larger than V3. To write data 01 to a memory cell, a soft write is performed in a state below state 3 to change the threshold voltage Vth of the memory cell to a voltage between V2 and V3. Similarly, to write data 10 to a memory cell, a soft write is performed in a state below state 2 to change the threshold voltage Vth of the memory cell to a voltage between V1 and V2. To write data 11 to a memory cell, the threshold voltage Vth of the memory cell is lowered to a voltage below V1 to place the memory cell into state 1.

The "soft write" means either writing which is performed at a lowered electric potential of the word line or of the bit line, or writing performed using write pulses with a narrow width. That is, the "soft write" is defined as writing wherein the threshold voltage Vth of the memory cell is gradually elevated by a write pulse.

Setting the number of write pulses required to change the cell state from state 1 to state 2 at three or more will lessen probability that state 2 is unintentionally skipped.

Now, let us think about a case that a memory cell is changeable from state 1 to state 2 by application of a single write pulse. In this case, if a pulse is applied for a particular memory cell when the memory cell is in state 1 but its data has deteriorated a little, it is possible that the memory cell changes from state 1 to state 2. Thus, the memory cell cannot be refreshed in state 1.

In the case that a memory cell is changeable from state 1 to state 2 by two write pulses, if a pulse is applied for a particular memory cell when the memory cell is in state 1 but its data has deteriorated a little, or if refresh pulses are erroneously applied, it is possible that the memory cell changes its state from state 1 to state 2, especially when the memory cell is a multi-valued memory cell. Accordingly, it is possible that erroneous data is written by refresh operation.

It is therefore desirable to have a circuit construction in which state 1 is changed to state 2 by three or more write pulses as described above. However, if the number of write pulses for changing state 1 to state 2 is set at 2, this setting is more effective in preventing erroneous write than when the number of write pulses is set at one.

FIG. 9 shows examples of commands of the flash memory. The command state machine 6 recognizes a command entered by a user. The write state machine 1 executes the recognized command.

For "BLOCK ERASE" command, data 20H (H indicates a hexadecimal number) is supplied to the data pin of the command state machine 6 in the first cycle during which both the $\overline{CE}$ pin 52 and the $\overline{WE}$ pin 51 have an "L" level. Then, in the second cycle during which both the $\overline{CE}$ pin 52 and the $\overline{WE}$ pin 51 have an "L" level, the data pin is supplied with data D0H and an address of a block to be erased.

For "DATA WRITE (PROGRAM)" command, data 40H (H indicates that the data is hexadecimal.) is input to the data pin in the first cycle during which both the $\overline{CE}$ pin 52 and the $\overline{WE}$ pin 51 have an "L" level. Then, in the second cycle during which both the $\overline{CE}$ pin 52 and the $\overline{WE}$ pin 51 have an "L" level, the data pin is supplied with data to be written to memory cells and the addresses of the memory cells.

Normally, the erase operation takes long. Thus, "ERASE SUSPEND" command is used. For the "ERASE SUSPEND" command, data B0H is input to the data pin in the first cycle during which both the $\overline{CE}$ pin 52 and the $\overline{WE}$ pin 51 have "L" level. In order to terminate the erase suspension and resume the erase operation, "ERASE RESUME" command is used. Specifically, data D0H is input to the data pin in the first cycle during which the $\overline{CE}$ pin 52 and the $\overline{WE}$ pin 51 have "L" level.

[READ OPERATION OF DATA OF MEMORY CELL]

The operation of reading data of the memory cell group 32 shown in FIG. 3 will be described below. The memory cell group 32 is composed of memory cells X0–Xn. In normal reading, the potential of the word line is set at V1, V2, or V3. One of signals Y0 through Yn shown in FIG. 3 is selected by the column decoder 10 shown in FIG. 1. One column decoder 10 is connected with the memory cells X0 through Xm. One of the memory cells X0 through Xn is selected by the row decoder 7.

In order to read the data of the selected memory cell, initially, the electric potential of the word line is set at V1. If the selected memory cell is in state 1, the memory cell is turned on and electric current flows. Thus, output Sout of the sense amplifier 31 shown in FIG. 3 becomes "L" level. On the other hand, if the selected memory cell is not in state 1, the selected memory cell is turned off. Thus, the output Sout of the sense amplifier 31 becomes "H" level.

After the output Sout of the sense amplifier 31 becomes "H" level, the electric potential of the word line is increased to V2. At this time, if that memory cell is in state 2, then the memory cell is turned on. Thus, electric current flows. As a result, the output Sout of the sense amplifier 31 becomes "L" level. If, however, the selected memory cell is placed in state 3 or state 4, then, the memory cell is turned off and the output Sout of the sense amplifier 31 has an "H" level.

After the sense amplifier 31 becomes "H" level, the electric potential of the word line is again elevated to V3. If the selected memory cell is in state 3 at this time, then the memory cell is turned on. Thus, electric current flows. As a result, the output Sout of the sense amplifier 31 becomes "L" level.

On the other hand, if the selected memory cell is in state 4, the memory cell keeps off. Consequently, the output Sout of the sense amplifier 31 has the "H" level.

Thus, the data of the memory cell can be read.

[REFRESH OPERATION]

The refresh operation is performed by the write state machine 1, based on a command set by a user.

The refresh operation is executed as follows. Initially, similarly to the read operation, the electric potential of the selected word line is increased from V1 to V2, from V2 to V3, and from V3 to V4 until a particular memory cell is turned on.

After the memory cell is turned on at an electric potential Vm (m is an integer of 1 through 4), the electric potential of the word line is then dropped by $\Delta V$ ($\Delta V$ is a constant) to become (Vm–$\Delta V$). At this time, if the memory cell is still ON, it is determined by the write state machine 1 that data on the memory cell is normal. On the other hand, if the memory cell is turned off at that time, the threshold voltage Vth of the memory cell has increased. Therefore, it is determined that the memory cell has become abnormal, and that it is necessary to erase the stored data of the memory cell and write the memory cell again. That is, a refresh is required.

Next, the electric potential of the word line is further dropped to ($V_{1-1}+\Delta V$). If the memory cell is turned on at this time, this means that electrons have left a floating gate of the memory cell. Thus, the soft write is performed on the memory cell until the memory cell is turned off.

When a refresh is performed to a memory cell which should be in state 4 (i.e., m=4) shown in FIG. 2, it is possible to omit the steps of setting the electric potential of the word line to V4 and dropping the electric potential to {V4−ΔV).

[REFRESH OPERATION USING "SINGLE BLOCK REFRESH" COMMAND]

A refresh operation to be executed using "single block refreshing" command will be described below.

The "SINGLE BLOCK REFRESH" command is also a two-cycle command to designate an address of a block to be refreshed, similarly to the "block (or sector) erase" command. FIG. 10 shows an example of this command wherein data 30H is written in the first cycle and data D0H in the second cycle.

The command state machine 6 decodes the command entered, and sends a decoded result to the write state machine (WSM) 1.

In the refresh operation, the erasing/writing voltage generation circuit 5 operates to generate an internal high voltage VHH, as in the programming operation. The circuit 5 is an internal elevated potential generation circuit composed of a pump circuit and a DC-DC conversion circuit.

Because in recent years the external power source VCC for non-volatile storage circuits has been lowered from 5 volts to 3 volts, the internal elevated voltage VHH of about 12 volts is utilized to generate the electric potential of the word line (Normally, about 5 volts is necessary in writing binary data.) in the refresh operation.

In the word line potential generation circuit shown in FIG. 4, the electric potential VHH from the erasing/writing voltage generation circuit 5 is divided by the voltage-dividing resistor 21 to obtain an electric potential necessary for performing the refresh operation. In order to select a first address of a designated block, the write state machine 1 generates the first address, and starts the refresh operation on that address. As described previously, because the refresh operation is accompanied by the erase operation, it cannot be performed on a single memory cell.

Normally, it is necessary to save data of a selected block (or sector) in another storage portion before erasing the block and then write the saved data back to the block. Such a data save area may be an internal save area or an external save area according to the size of the erase block.

If the save area is not provided on the same chip of the flash memory, a refresh request bit is set on a predetermined bit of a status register (or block status register) in the flash memory.

When a refresh of the first address of the particular block terminates, the write state machine 1 generates the next address of the block and performs the refresh operation for the next address. The write state machine 1 changes addresses one after another, and performs a data refresh if necessary. In this way, all the memory cells of the particular block are refreshed.

[REFRESH OPERATION USING "FULL CHIP REFRESH" COMMAND]

A refresh operation to be executed using a ""FULL CHIP REFRESH" command will be described below.

The "FULL CHIP REFRESH" command is to perform the refresh operation of individual blocks in series, similarly to the "FULL CHIP ERASE" command. FIG. 10 shows an example of writing data B7H in the first cycle and data D0H in the second cycle. At this time, when a refresh operation involving a block erase is required, a single memory cell cannot be erased because data is erased block by block (or sector by sector). Therefore, normally, it is necessary to save the data of a block (or sector) in another storage area before erasing the block and then, rewrite the saved data to the block.

If a data save area is not provided on the same chip, a refresh demand bit is set on a special status register in the flash memory. The refresh demand bit may be set on a block status register for a particular block (the status registers are provided for each erase block). Otherwise, the refresh demand bit may be output to a predetermined bit of a compatible status register (CSR) shown in FIG. 6, i.e., the R1 bit shown in FIG. 6 may be set at "H" level.

It takes a comparatively long time to perform the full chip refresh operation because it is performed block by block. If a power failure occurs during the refresh operation, a signal indicating the power failure is supplied to the status register shown in FIG. 6 to set the VPSS bit (i.e., bit 3) to "H" level.

Figure 6:
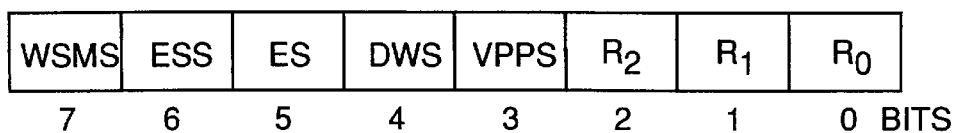
FIG. 6 shows an example of a status register to be used in the embodiment.

During refresh, a particular bit of the status register indicating a refresh operation in progress is set. That is, R2 (bit 2) shown in FIG. 6 is set to "H" level to inform a user that the refresh operation is in progress. Thus, it is possible to achieve a user-friendly memory device.

In FIG. 6, WSMS represents "Write State Machine Status", ESS represents "Erase-Suspend Status", ES represents "Erase Status", DWS represents "Data-Write Status" and VPPS represents "$V_{pp}$ Status."

The flash memory will be made more convenient by setting information indicating the refresh operation is in progress on the corresponding block status register as well.

It takes a comparatively long time to perform the refresh operation. Thus, "REFRESH SUSPEND" command allows the user to use the non-volatile semiconductor memory conveniently. When the "REFRESH SUSPEND" command is entered, the command state machine 6 decodes the "REFRESH SUSPEND" command, and sends a decoded result to the write state machine (WSM) 1. As a result, the write state machine (WSM) 1 suspends the refresh operation to enable a read operation. That is, the read operation can be performed during the refresh operation, which allows the memory to become more user-friendly.

Further, in addition to the read operation, a write operation and/or a single block erase operation may be enabled during the refresh process. This will be more convenient to the user.

In order to resume the refresh operation after suspending the refresh operation, "REFRESH RESUME" command is used. If the "ERASE RESUME" command is also used as the "REFRESH RESUME" command, and/or if the "ERASE SUSPEND" command is also used as the "REFRESH SUSPEND" command, the total number of commands can be reduced accordingly. Thus, advantageously, a simpler control can be achieved.

Figure 7:
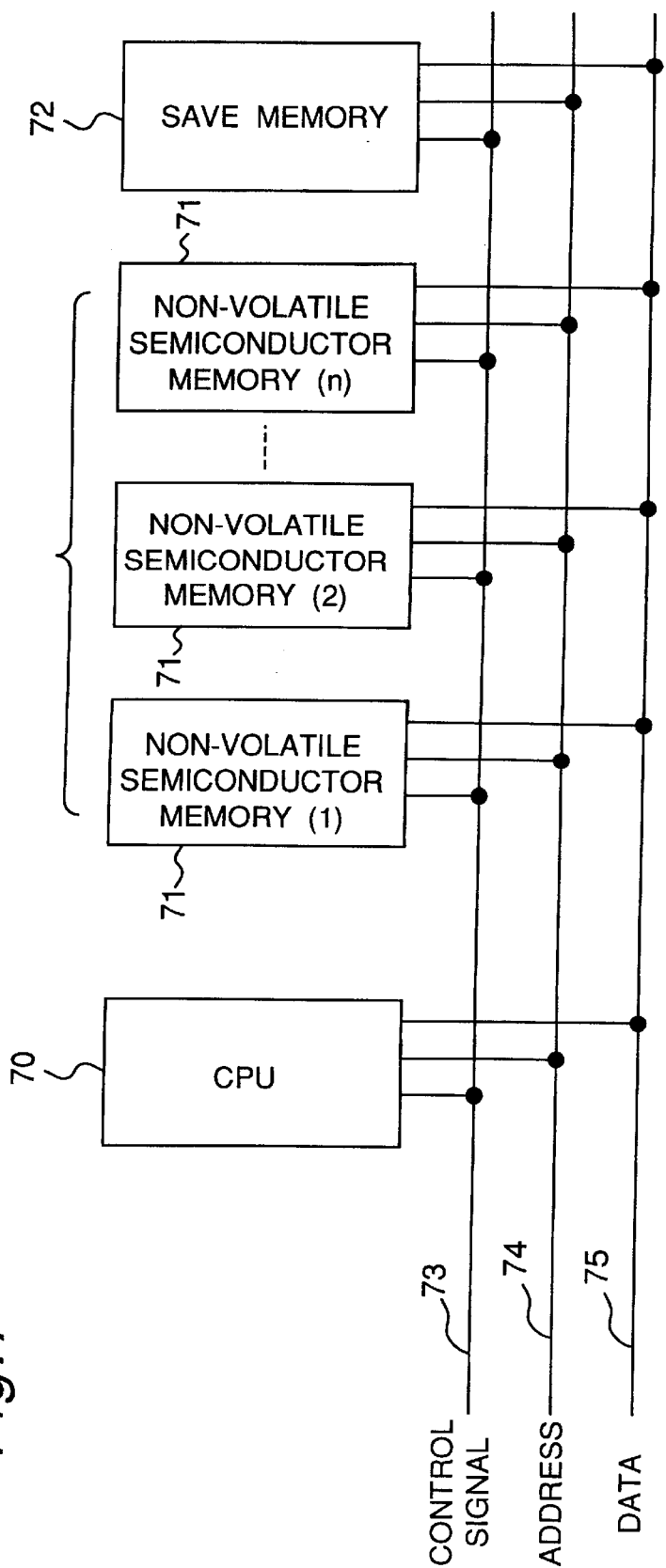
FIG. 7 is a block diagram showing another embodiment of the present invention.

FIG. 7 shows a memory device having a plurality of the non-volatile semiconductor memories of the above-described embodiment. The memory device has a CPU (control section) 70, n non-volatile semiconductor memories 71, and a save memory 72 consisting of a DRAM, a SRAM or a non-volatile memory. These parts 70, 71, 72 are connected with a control signal line 73, an address bus 74, and a data bus 75.

In the memory device, "REFRESH START" command is supplied to the non-volatile semiconductor memories 71 sequentially from the control signal line 73 periodically (or when power is turned on or before power is turned off). Upon turning on power, a program necessary for start-up of a system incorporating the memory device is read out from a non-volatile semiconductor memory 71 storing the system start-up program, and refresh commands are supplied to the other non-volatile semiconductor memories 71 sequentially, and storage data is refreshed. Finally, a refresh operation is performed on the non-volatile semiconductor memory 71 storing the system start-up program.

If the save memory 72 of FIG. 7 is constituted of a random access memory (RAM) having a storage capacity more than that of a erase block or of a ferroelectric non-volatile memory, the refresh operation is able to be performed reliably.

Figure 8:
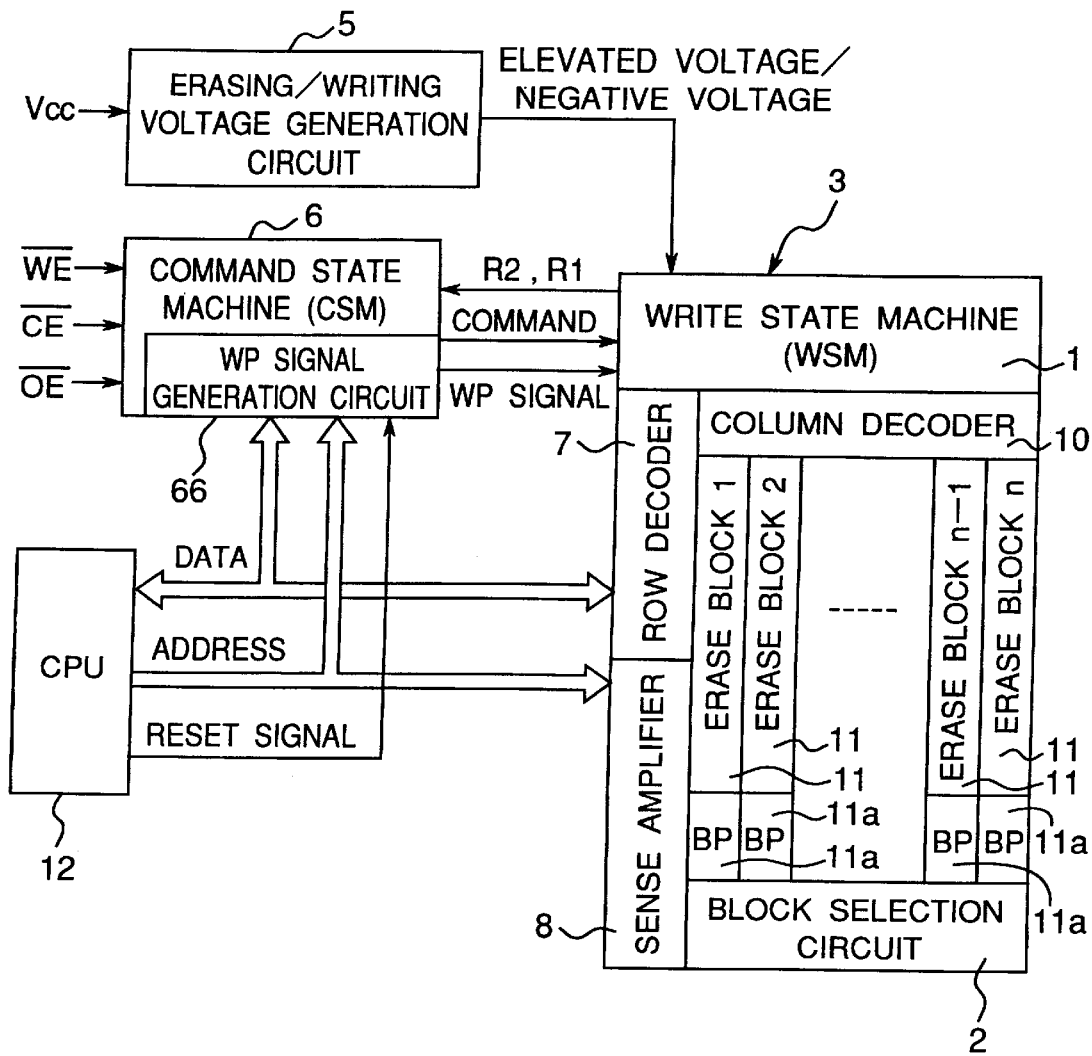
FIG. 8 is a block diagram showing a modification of the embodiment.
Figure 11:
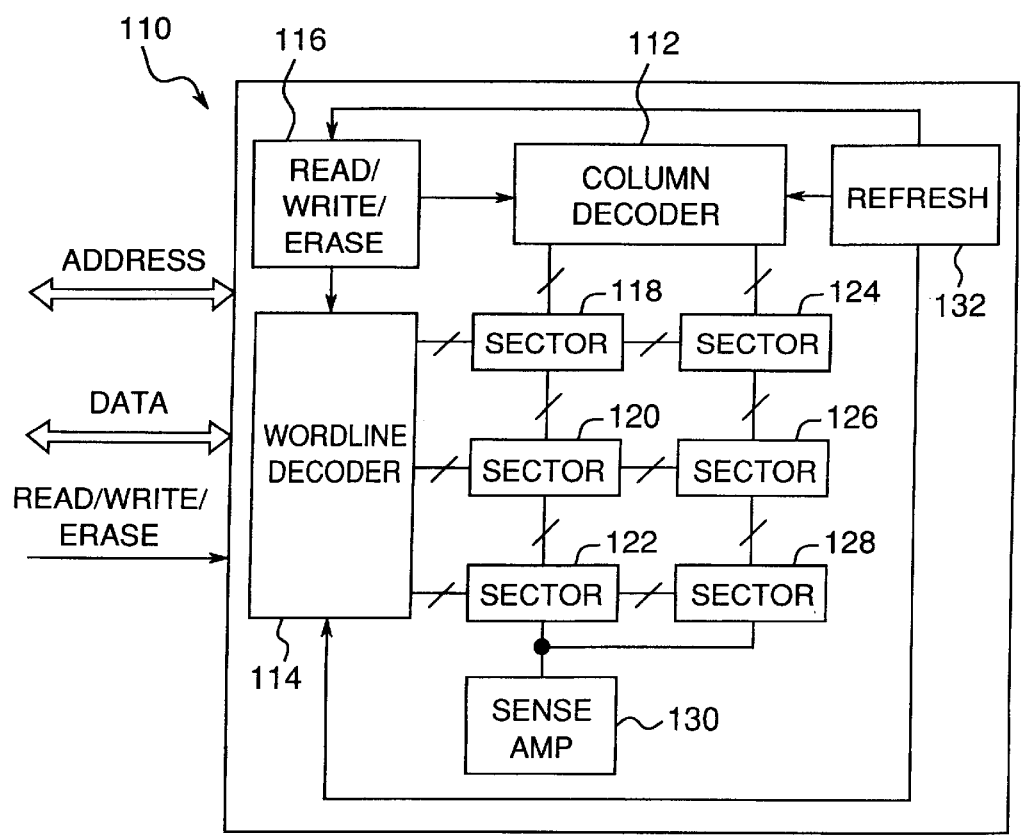
FIG. 11 is a block diagram showing a conventional non-volatile semiconductor memory.
Figure 12:
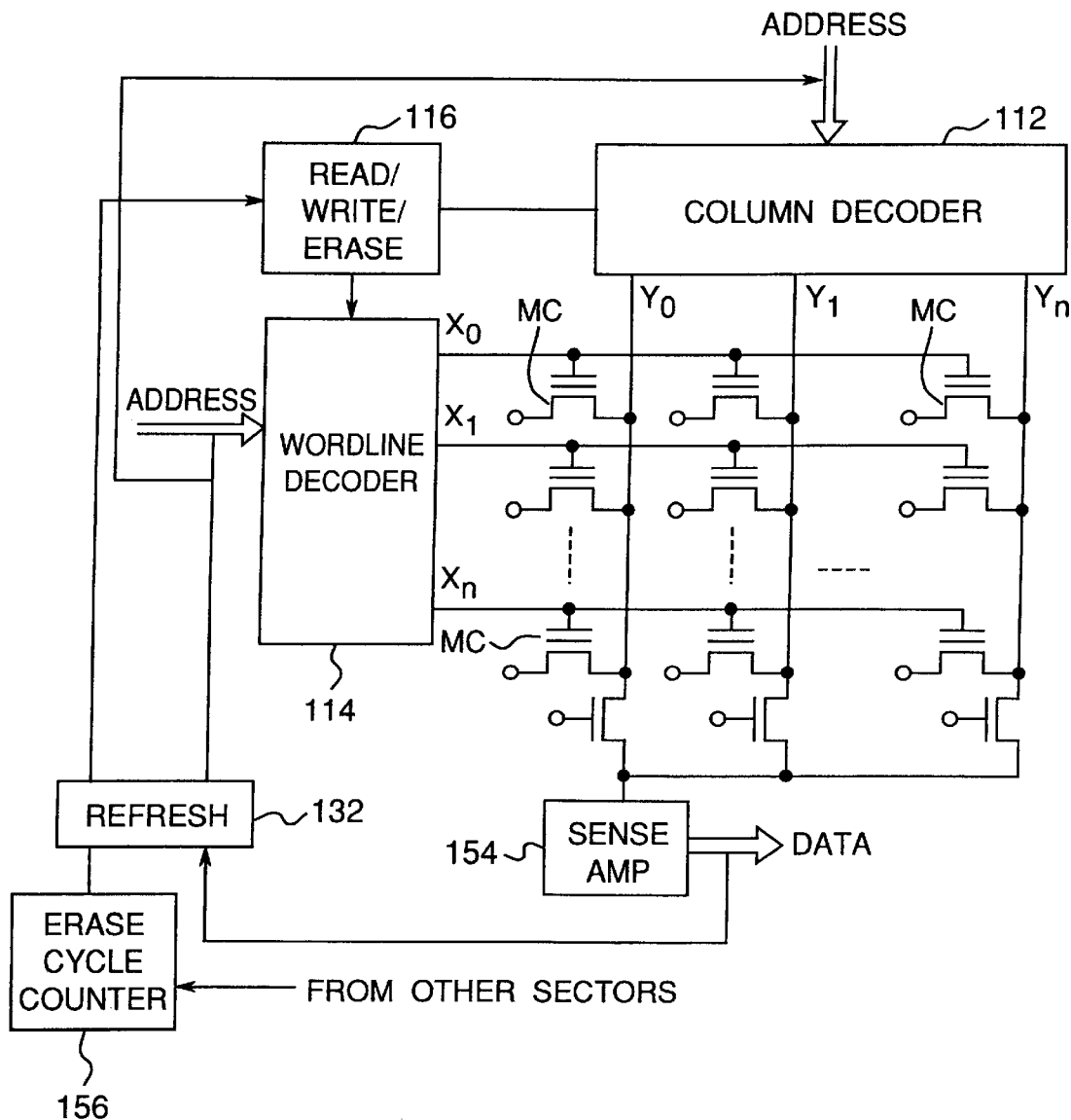
FIG. 12 shows an array of memory cells in the conventional non-volatile semiconductor memory.
Figure 13:
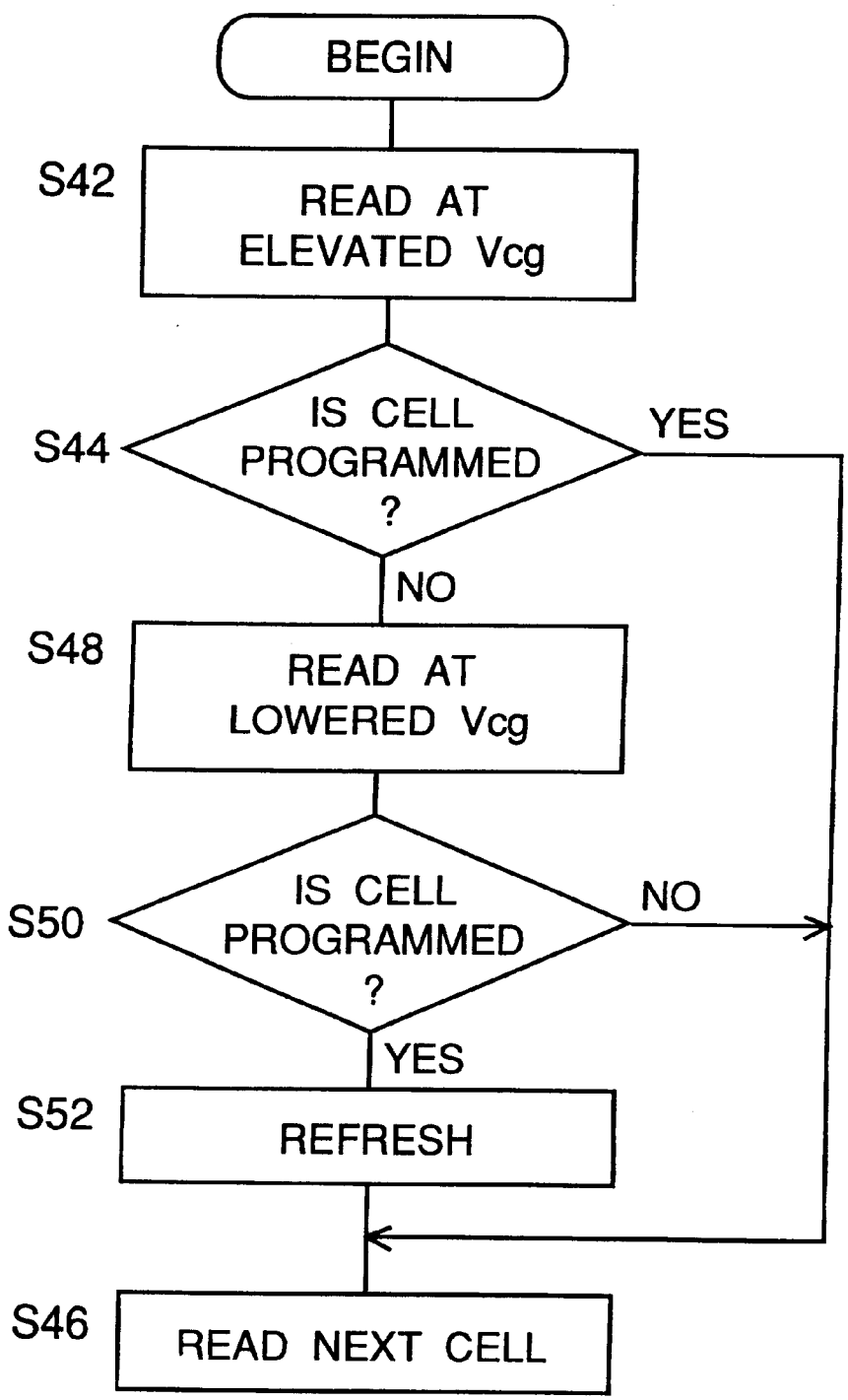
FIG. 13 is a flowchart for explaining a refresh operation of the conventional non-volatile semiconductor memory.

FIG. 8 is a block diagram showing a non-volatile semiconductor memory according to another embodiment of the present invention and FIG. 8A shows a compatible status register same used for the non-volatile semiconductor memory of FIG. 8, which is same as that shown in FIG. 6.

The FIG. 8 embodiment is different from the FIG. 1 embodiment in that in the FIG. 8 embodiment each erase block 11 has a block protect setting portion (BP) 11a and that the command state machine 6 has a WP signal generation circuit 66 to deliver a write protect signal WP.

When the write protect signal WP output from the WP signal generation circuit 66 has a "H" level, the block protect setting portion 11a is valid. When the block protect setting portion 11a has a "H" level, rewrite of the erase block 11 is prohibited. When the block protect setting portion 11a has a "L" level, rewrite of the erase block 11 is allowed.

When the write protect signal WP has "L" level, the block protect setting portion 11a is invalid, and it is possible to rewrite the erase block 11 regardless of whether the block protect setting portion 11a has "H" level or "L" level.

Figure 5:
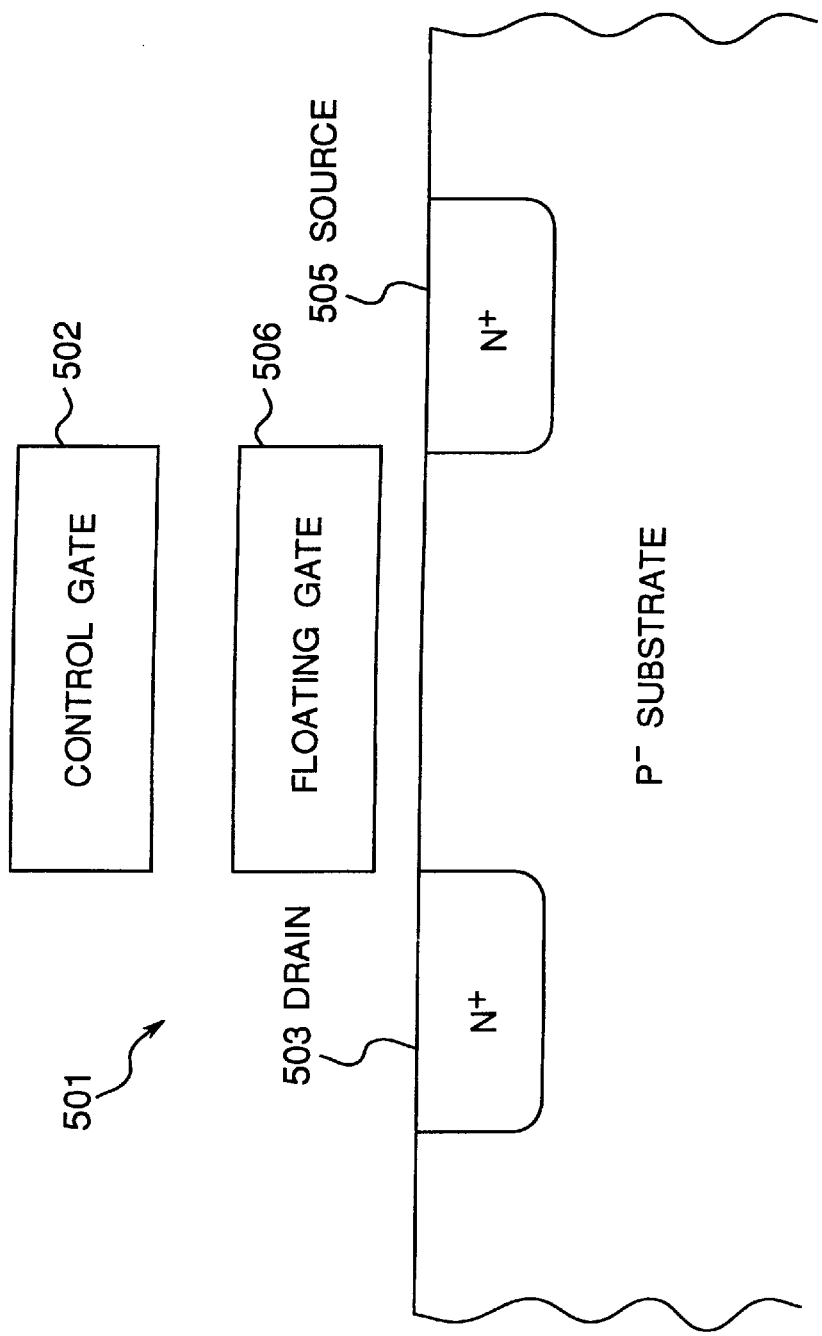
FIG. 5 shows a structure of a memory cell comprised of a floating gate type field effect transistor.

In the FIG. 8 embodiment, memory cells may have a structure same as that of the conventional memory cell shown in FIG. 5 or a structure in which a ferroelectric thin film is used as a gate oxide film. In the latter case using a ferroelectric thin film, polarization inversion is utilized. Thus, advantageously, it is unnecessary to use a very thin tunnel oxide film unlike the conventional art and also, it is possible to achieve high integration.

If a large threshold voltage Vth of the memory cell is associated with the erased state conversely to the embodiments, all the memory cells are first programmed to have a high threshold voltage Vth. After that, the threshold voltage Vth of each memory cell is lowered.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A non-volatile semiconductor memory to write memory cells block by block or sector by sector by a command method in which a predetermined operation is performed according to data and/or an address entered from outside according to a bus cycle, comprising:
   a refresh command setting unit outputting a refresh command in accordance with a command entered by a user, said refresh command including a command to perform a refresh operation, a command to suspend the refresh operation, and a command to resume the refresh operation;
   a refresh unit performing a refresh operation on a selected block or sector, said refresh unit starting and stopping in accordance with the refresh command received from said refresh command setting unit.

2. A non-volatile semiconductor memory according to claim 1, wherein said refresh command is a "SINGLE BLOCK REFRESH" command by which only a single block or sector is refreshed.

3. A non-volatile semiconductor memory according to claim 1, wherein said refresh command set by the refresh command setting unit is "FULL CHIP REFRESH" command by which all blocks or sectors on a chip are sequentially refreshed.

4. A non-volatile semiconductor memory according to claim 1, wherein in a refresh operation, a word line potential is supplied from a high-voltage generation circuit different from a circuit supplying a word line potential used in an ordinary memory read operation.

5. A non-volatile semiconductor memory according to claim 1, further comprising:
   an internal high voltage generation circuit generating an elevated voltage higher than a power source voltage;
   a word line potential generation circuit generating a first word line potential and a second word line potential different from the first word line potential on the basis of the elevated voltage generated by said internal high voltage generation circuit when the refresh command is executed, said first word line potential being equivalent to a word line potential used for an ordinary memory read operation;
   reading means for performing a first read operation in which a memory cell is read at the first word line potential, and then performing a second read operation in which the memory cell is read at the second word line potential; and
   decision means for comparing data read by the first read operation with data read by the second read operation and determining that data stored on the memory cell is normal if the two data are same and that the data stored on the memory cell is abnormal if the two data are different from each other, said refresh unit performing a refresh upon the memory cell when said decision means determines that the data stored on the memory cell is abnormal.

6. A non-volatile semiconductor memory according to claim 5, wherein said second word line potential is higher than the first word line potential, and when the memory cell is determined to be abnormal, said refresh unit increases a threshold voltage of the memory cell by a soft write technique.

7. A non-volatile semiconductor memory according to claim 5, wherein said second word line potential is lower than the first word line potential, and when the memory cell is determined to be abnormal, said refresh unit decreases a threshold voltage of the memory cell.

8. A non-volatile semiconductor memory according to claim 5, further comprising:
   a refresh status informing means for allowing a user to know a refresh status of the memory, said refresh status informing means setting on a status register an information bit indicating a refresh operation in progress while the refresh operation is being performed, and clearing the information bit upon completion of the refresh operation.

9. A non-volatile semiconductor memory according to claim 8, wherein said refresh status informing means further sets on the status register an information bit indicating that a refresh is needed when said decision means determines that the data of the memory cell is abnormal.

10. A non-volatile semiconductor memory according to claim 1, further comprising:
   block size decision means for determining whether a size of a block including a memory cell to be refreshed is smaller than a predetermined size,
   wherein if said block size decision means decides that the size of the block is smaller than the predetermined size, said refresh means saves data of the block in an internal storage area, then erases the block, and then writes the data saved in the internal storage area to said memory cell in the refresh operation.

11. A non-volatile semiconductor memory according to claim 1, further comprising:

block size decision means for determining whether a size of a block including a memory cell to be refreshed is smaller than a predetermined size, wherein if said block size decision means decides that the size of the block is not smaller than the predetermined size, said refresh unit saves data of the block in an external storage area, then erases the block, and then writes the data saved in the external storage area to the memory cell in the refresh operation.

12. A non-volatile semiconductor memory according to claim 10, wherein said internal storage area is composed of a non-volatile semiconductor memory.

13. A non-volatile semiconductor memory according to claim 10, wherein said external storage area is composed of a non-volatile semiconductor memory.

14. A non-volatile semiconductor memory according to claim 1, wherein said refresh commend setting unit further sets a "REFRESH SUSPEND" and a "REFRESH RESUME" commands to suspend a refresh operation in progress and then resume the refresh operation.

15. A non-volatile semiconductor memory according to claim 14, wherein said "REFRESH SUSPEND" and "REFRESH RESUME" commands are entered by a user.

16. A non-volatile semiconductor memory according to claim 14, wherein an "ERASE SUSPEND" command suspending a block erase operation is used also as the "REFRESH SUSPEND" command, while an "ERASE RESUME" command resuming the block erase operation is used also as the "REFRESH RESUME" command.

17. A non-volatile semiconductor memory according to claim 1, wherein each memory cell stores multi-valued data.

18. A non-volatile semiconductor memory according to claim 1, wherein said refresh unit rewrite a memory cell by repeating a write operation plurality of times to thereby increase a threshold voltage of the memory cell stepwise to a target value.

19. A non-volatile semiconductor memory according to claim 18, wherein said refresh unit repeats the write operation at least 3 times.

* * * * *

UNITED STATES PATENT AND TRADEMARK OFFICE
CERTIFICATE OF CORRECTION

PATENT NO. : 6,240,032 B1
DATED : May 29, 2001
INVENTOR(S) : Katsumi Fukumoto

It is certified that error appears in the above-identified patent and that said Letters Patent is hereby corrected as shown below:

<u>Title page,</u>
Item [22], Filed: change "Nov. 24, 1998" to -- Nov. 25, 1998 --.

Signed and Sealed this

Thirtieth Day of April, 2002

Attest:

JAMES E. ROGAN
*Attesting Officer*    *Director of the United States Patent and Trademark Office*